(12) United States Patent
Shimizu et al.

(10) Patent No.: US 10,256,308 B1
(45) Date of Patent: Apr. 9, 2019

(54) SEMICONDUCTOR DEVICE, POWER SUPPLY CIRCUIT, AND COMPUTER

(71) Applicant: Kabushiki Kaisha Toshiba, Minato-ku (JP)

(72) Inventors: Tatsuo Shimizu, Shinagawa (JP); Toshiya Yonehara, Kawasaki (JP); Hiroshi Ono, Setagaya (JP); Daimotsu Kato, Kawasaki (JP); Akira Mukai, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/905,877

(22) Filed: Feb. 27, 2018

(30) Foreign Application Priority Data

Nov. 22, 2017 (JP) .................................. 2017-224450

(51) Int. Cl.
*H01L 29/40* (2006.01)
*H01L 29/20* (2006.01)
(Continued)

(52) U.S. Cl.
CPC ............ *H01L 29/408* (2013.01); *G06F 1/181* (2013.01); *H01L 29/2003* (2013.01);
(Continued)

(58) Field of Classification Search
CPC ............ H01L 29/1608; H01L 29/7802; H01L 29/518; H01L 29/517
See application file for complete search history.

(56) References Cited

U.S. PATENT DOCUMENTS 9,397,185 B2  7/2016  Watanabe et al.
9,818,855 B2  11/2017  Saito et al.
(Continued)

FOREIGN PATENT DOCUMENTS

JP  2005-183597  7/2005
JP  2014-110402  6/2014
(Continued)

OTHER PUBLICATIONS

Ryohei Asahara et al., "Effect of nitrogen incorporation into Al-based gate insulators in AlON/AlGaN/GaN metal-oxide-semiconductor structures", Applied Physics Express 9, vol. 101002, 2016, 5 total pages.
(Continued)

*Primary Examiner* — Dung A. Le
(74) *Attorney, Agent, or Firm* — Oblon, McClelland, Maier & Neustadt, L.L.P.

(57) ABSTRACT

A semiconductor device according to an embodiment includes a first nitride semiconductor layer; a second nitride semiconductor layer on the first nitride semiconductor layer; a first electrode and a second electrode disposed on or above the first nitride semiconductor layer; a gate electrode above the first nitride semiconductor layer; and a gate insulating layer, the gate insulating layer including a silicon oxide film and an aluminum oxynitride film, the aluminum oxynitride film disposed between the first nitride semiconductor layer and the silicon oxide film, a first atomic ratio of nitrogen relative to a sum of oxygen and nitrogen at a first position in the aluminum oxynitride film being higher than a second atomic ratio of nitrogen relative to a sum of oxygen and nitrogen at a second position in the aluminum oxynitride film, and the second position being closer to the silicon oxide film than the first position.

11 Claims, 12 Drawing Sheets

(51) Int. Cl.
*H01L 29/205* (2006.01)
*H01L 29/778* (2006.01)
*G06F 1/18* (2006.01)
*H01L 29/51* (2006.01)
*H01L 29/423* (2006.01)

(52) U.S. Cl.
CPC .......... *H01L 29/205* (2013.01); *H01L 29/513* (2013.01); *H01L 29/7787* (2013.01); *H01L 29/4236* (2013.01)

(56) References Cited

U.S. PATENT DOCUMENTS

| | | | |
|---|---|---|---|
| 2008/0203541 A1* | 8/2008 | Makiyama | C23C 16/345 257/640 |
| 2014/0097505 A1* | 4/2014 | Yoshioka | H01L 29/4175 257/410 |
| 2017/0077277 A1 | 3/2017 | Saito et al. | |
| 2018/0026107 A1 | 1/2018 | Shimizu et al. | |

FOREIGN PATENT DOCUMENTS

| | | |
|---|---|---|
| JP | 2017-59599 | 3/2017 |
| JP | 2018-14456 | 1/2018 |

OTHER PUBLICATIONS

Kenta Watanabe et al., "SiO$_2$/AlON stacked gate dielectrics for AlGaN/GaN MOS-HEMT", The 63$^{rd}$ Spring Meeting lecture proceedings 2016, The Japan Society of Applied Physics, 2016, 3 total pages (with English translation).

\* cited by examiner

SEMICONDUCTOR DEVICE, POWER SUPPLY CIRCUIT, AND COMPUTER

CROSS-REFERENCE TO RELATED APPLICATION

This application is based upon and claims the benefit of priority from Japanese Patent Application No. 2017-224450, filed on Nov. 22, 2017, the entire contents of which are incorporated herein by reference.

FIELD

Embodiments described herein relate generally to a semiconductor device, a power supply circuit, and a computer.

BACKGROUND

Semiconductor elements such as transistors and diodes are used in circuits such as switching power supply circuits and inverter circuits. These semiconductor elements are required to have high breakdown voltage and low on-resistance. Then, there is a trade-off relation determined by an semiconductor material as a relation between a breakdown voltage and an on-resistance.

Along with progress in technology development, the low on-resistance has been realized in semiconductor elements up to near the limit of silicon which is the major semiconductor material. It is necessary to change the semiconductor material in order to further improve the breakdown voltage and further reduce the on-resistance. It is possible to improve the trade-off relation determined by the semiconductor material and to realize remarkable high breakdown voltage and low on-resistance by using a nitride semiconductor, such as gallium nitride and aluminum gallium nitride, as the semiconductor material of the semiconductor element.

In a transistor using the nitride semiconductor, however, charges are injected into an insulating layer formed on the nitride semiconductor, which results in degradation of characteristics such as a fluctuation of a threshold voltage, an increase of a leakage current of the insulating layer, and an increase of an on-resistance.

DETAILED DESCRIPTION

Figure 1:
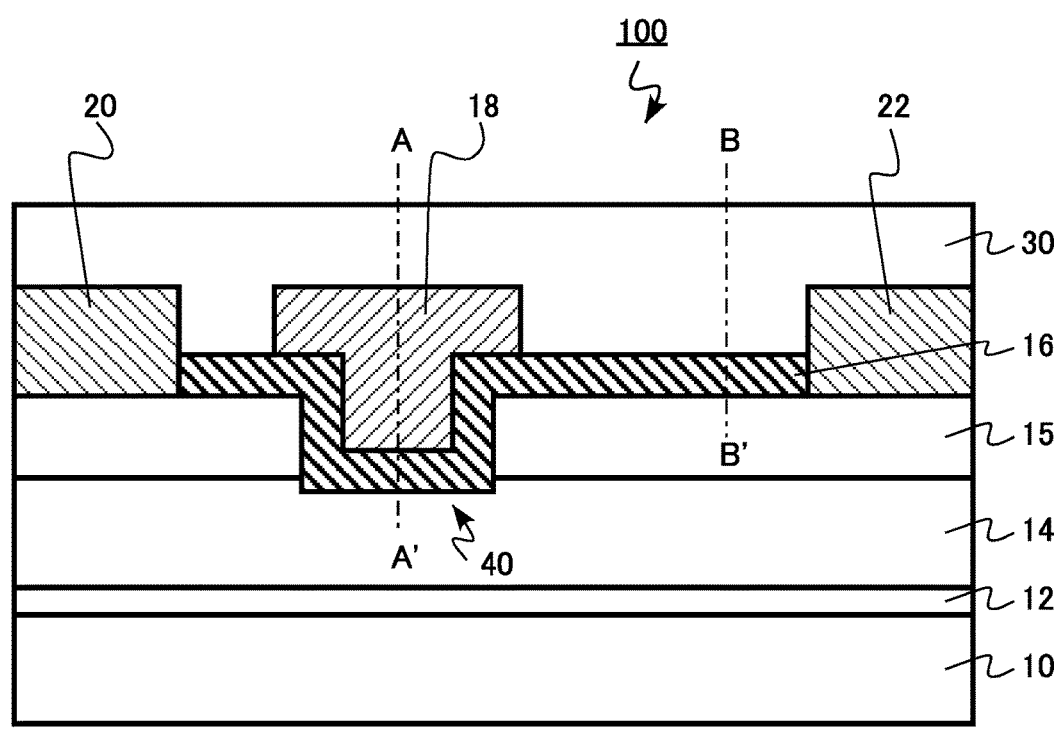
FIG. 1 is a schematic cross-sectional view of a semiconductor device according to a first embodiment.

A semiconductor device according to an embodiment includes: a first nitride semiconductor layer; a second nitride semiconductor layer disposed on the first nitride semiconductor layer and having a larger bandgap than that of the first nitride semiconductor layer; a first electrode disposed on or above the first nitride semiconductor layer and electrically connected to the first nitride semiconductor layer; a second electrode disposed on or above the first nitride semiconductor layer and electrically connected to the first nitride semiconductor layer; a gate electrode disposed above the first nitride semiconductor layer, the gate electrode disposed between the first electrode and the second electrode; and a gate insulating layer disposed between the first nitride semiconductor layer and the gate electrode, the gate insulating layer including a silicon oxide film and an aluminum oxynitride film, the aluminum oxynitride film disposed between the first nitride semiconductor layer and the silicon oxide film, a first atomic ratio of nitrogen relative to a sum of oxygen and nitrogen at a first position in the aluminum oxynitride film being higher than a second atomic ratio of nitrogen relative to a sum of oxygen and nitrogen at a second position in the aluminum oxynitride film, and the second position being closer to the silicon oxide film than the first position.

Hereinafter, embodiments of the present disclosure will be described with reference to the drawings. In the following description, the same members and the like will be denoted by the same reference numerals, and members that have been once described will not be described as appropriate.

In the present specification, the "GaN-based semiconductor" is a generic name of semiconductors having gallium nitride (GaN), aluminum nitride (AlN), indium nitride (InN), and intermediate compositions of these elements.

In the present specification, the term "undoped" means that an impurity concentration is equal to or lower than $1\times10^{15}$ cm$^{-3}$.

In the present specification, the upward direction of the drawing will be described as "upper" and the downward direction of the drawing will be described as "lower" in order to indicate a positional relation among parts and the like. In this specification, the concepts of "upper" and "lower" are not necessarily terms indicating a relation with respect to the direction of gravity.

First Embodiment

A semiconductor device according to a first embodiment includes: a first nitride semiconductor layer; a second nitride semiconductor layer disposed on the first nitride semiconductor layer and having a larger bandgap than the first nitride semiconductor layer; a first electrode disposed on the first nitride semiconductor layer and electrically connected to the first nitride semiconductor layer; a second electrode disposed on the first nitride semiconductor layer and electrically connected to the first nitride semiconductor layer; a gate electrode disposed on the first nitride semiconductor layer between the first electrode and the second electrode; and a gate insulating layer disposed between the first nitride semiconductor layer and the gate electrode, including a silicon oxide film and an aluminum oxynitride film between the first nitride semiconductor layer and the silicon oxide film, and having a first atomic ratio of nitrogen relative to a sum of oxygen and nitrogen at a first position in the aluminum oxynitride film which is higher than a second atomic ratio of nitrogen relative to a sum of oxygen and nitrogen at a second position, closer to the silicon oxide film than the first position, in the aluminum oxynitride film.

FIG. 1 is a schematic cross-sectional view of the semiconductor device according to the first embodiment. The semiconductor device of the first embodiment is a high electron mobility transistor (HEMT) 100 using a GaN-based semiconductor. The HEMT 100 has a gate-recess structure in which a gate electrode is provided inside a trench (recess).

The HEMT 100 includes: a substrate 10; a buffer layer 12; a channel layer 14 (the first nitride semiconductor layer); a barrier layer 15 (the second nitride semiconductor layer); a gate insulating layer 16; a gate electrode 18; a source electrode 20 (the first electrode); a drain electrode 22 (the second electrode); an interlayer insulating layer 30; and a trench 40.

The bottom of the trench 40 is positioned inside the channel layer 14. The gate insulating layer 16 and the gate electrode 18 are formed inside the trench 40. As the bottom of the trench 40 is positioned in the channel layer 14, a two-dimensional electron gas below the gate electrode 18 is reduced. Therefore, it is possible to realize a normally-off operation.

The substrate 10 is made of, for example, silicon (Si). It is also possible to apply, for example sapphire ($Al_2O_3$) or silicon carbide (SiC) other than silicon.

The buffer layer 12 is provided on the substrate 10. The buffer layer 12 has a function of mitigating lattice mismatching between the substrate 10 and the channel layer 14. The buffer layer 12 is formed to have a multilayer structure of, for example, aluminum gallium nitride ($Al_WGa_{1-W}N$ (0<W<1)).

The channel layer 14 is provided on the buffer layer 12. The channel layer 14 is also referred to as an electron transit layer. The channel layer 14 contains gallium (Ga). The channel layer 14 is, for example, undoped $Al_XGa_{1-X}N$ (0≤X<1). More specifically, the channel layer 14 is, for example, undoped gallium nitride (GaN). A film thickness of the channel layer 14 is, for example, 0.1 μm to 10 μm.

The barrier layer 15 is provided on the channel layer 14. The barrier layer 15 is also referred to as an electron supply layer. A bandgap of the barrier layer 15 is larger than a bandgap of the channel layer 14. The barrier layer 15 contains gallium (Ga). The barrier layer 15 is, for example, undoped aluminum gallium nitride ($Al_YGa_{1-Y}N$ (0<Y≤1, X<Y)). More specifically, the barrier layer 15 is, for example, undoped $Al_{0.25}Ga_{0.75}N$. A film thickness of the barrier layer 15 is, for example, 10 nm to 100 nm.

A heterojunction interface is formed between the channel layer 14 and the barrier layer 15. The two-dimensional electron gas (2DEG) is formed at the heterojunction interface and becomes a carrier of the HEMT 100.

The source electrode 20 is provided on the channel layer 14 and the barrier layer 15. The source electrode 20 is electrically connected to the channel layer 14 and the barrier layer 15.

The source electrode 20 is, for example, a metal electrode. The source electrode 20 has, for example, a stacked structure of titanium (Ti) and aluminum (Al). It is desirable to obtain ohmic contact between the source electrode 20 and the barrier layer 15.

The drain electrode 22 is provided on the channel layer 14 and the barrier layer 15. The drain electrode 22 is electrically connected to the channel layer 14 and the barrier layer 15.

The drain electrode 22 is, for example, a metal electrode. The drain electrode 22 has, for example, a stacked structure of titanium (Ti) and aluminum (Al). It is desirable to obtain ohmic contact between the drain electrode 22 and the barrier layer 15.

A distance between the source electrode 20 and the drain electrode 22 is, for example, 5 μm to 30 μm.

Incidentally, it is also possible to provide a structure in which the source electrode 20 and the drain electrode 22 are in contact with the channel layer 14.

At least a part of the gate electrode 18 is formed inside the trench 40. The gate electrode 18 is provided on the barrier layer 15. The gate electrode 18 is provided between the source electrode 20 and the drain electrode 22.

The gate electrode 18 is, for example, a metal electrode. The gate electrode 18 is, for example, titanium nitride (TiN).

At least a part of the gate insulating layer 16 is formed inside the trench 40. The gate insulating layer 16 is positioned between the channel layer 14 and the gate electrode 18. The gate insulating layer 16 is in contact with the channel layer 14.

The gate insulating layer 16 is also formed on the barrier layer 15 between the gate electrode 18 and the drain electrode 22. The gate insulating layer 16 is also formed on the barrier layer 15 between the gate electrode 18 and the source electrode 20.

Figure 2:
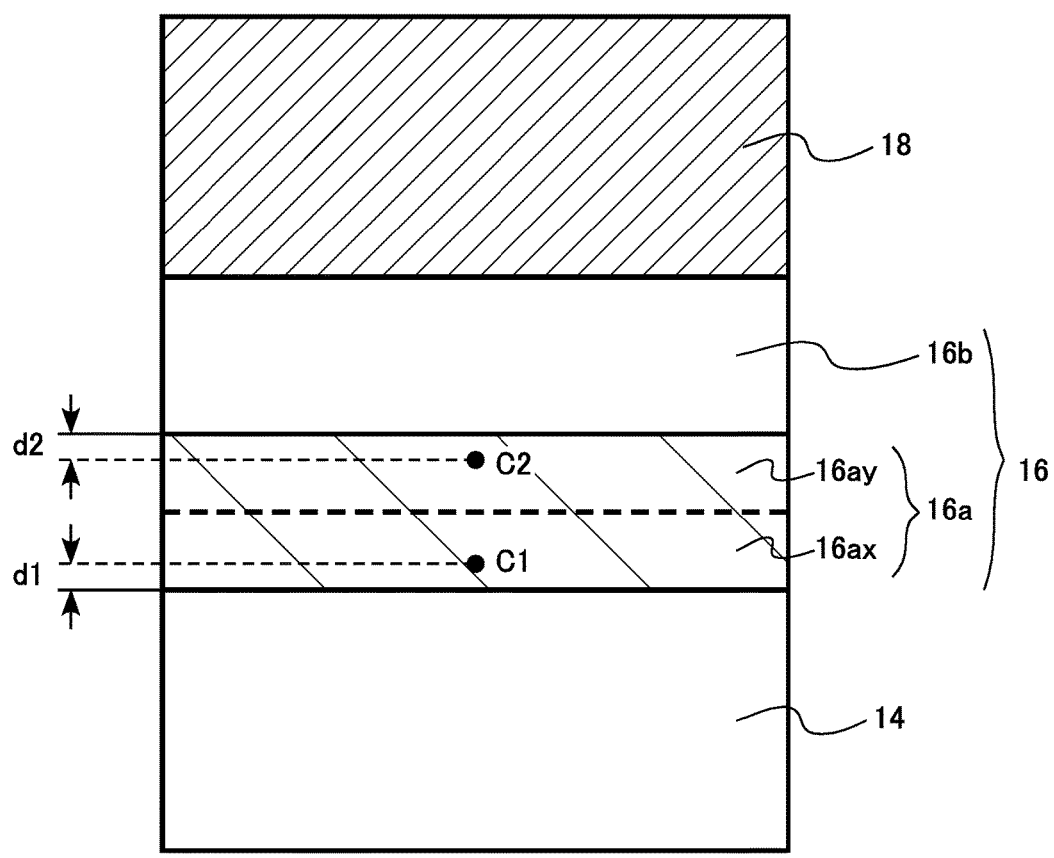
FIG. 2 is a schematic enlarged cross-sectional view of the semiconductor device according to the first embodiment.

FIG. 2 is a schematic enlarged cross-sectional view of the semiconductor device according to the first embodiment. FIG. 2 is the enlarged view of the gate insulating layer 16 between the channel layer 14 and the gate electrode 18. FIG. 2 is the view of a part taken along a line AA' of FIG. 1.

The gate insulating layer 16 has an aluminum oxynitride film 16a and a silicon oxide film 16b. The aluminum oxynitride film 16a is positioned between the channel layer 14 and the silicon oxide film 16b.

The aluminum oxynitride film 16a is in contact with the channel layer 14. The silicon oxide film 16b is in contact with the gate electrode 18. The aluminum oxynitride film 16a is, for example, amorphous.

A thickness of the gate insulating layer 16 is, for example, 20 nm to 100 nm. An equivalent oxide thickness (EOT) of the gate insulating layer 16 is, for example, 20 nm to 40 nm.

The aluminum oxynitride film 16a contains aluminum (Al), oxygen (O), and nitrogen (N) as main constituent elements. A first atomic ratio (N/(O+N)) of nitrogen relative to a sum (O+N) of oxygen (O) and nitrogen (N) at a first position (C1 in FIG. 2) in the aluminum oxynitride film 16a is higher than a second atomic ratio of nitrogen (N/(O+N)) relative to a sum (O+N) of oxygen (O) and nitrogen (N) at a second position (C2 in FIG. 2) closer to the silicon oxide film 16b than the first position C1 in the aluminum oxynitride film 16a. In other words, the aluminum oxynitride film 16a has a nitrogen concentration on the channel layer 14 side which is higher than a nitrogen concentration on the gate electrode 18 side.

The aluminum oxynitride film 16a has, for example, a two-layer structure. The aluminum oxynitride film 16a includes a first region 16ax and a second region 16ay. The second region 16ay is positioned between the first region 16ax and the silicon oxide film 16b. The first position C1 is in the first region 16ax, and the second position C2 is in the second region 16ay.

The first atomic ratio is, for example, 0.70 to 0.87. The second atomic ratio is, for example, 0.13 to 0.30.

The first position C1 is, for example, in the vicinity of an interface between the channel layer 14 and the aluminum oxynitride film 16a. For example, a distance (d1 in FIG. 2) from the interface between the channel layer 14 and the aluminum oxynitride film 16a to the first position C1 is 0.5 nm or shorter.

The second position C2 is, for example, in the vicinity of an interface between the silicon oxide film 16b and the aluminum oxynitride film 16a. For example, a distance (d2 in FIG. 2) from the interface between the silicon oxide film 16b and the aluminum oxynitride film 16a to the second position C2 is 0.5 nm or shorter.

For example, the distribution of the nitrogen concentration in the aluminum oxynitride film 16a may have gradient distribution of decreasing from the channel layer 14 side toward the silicon oxide film 16b. In other words, an atomic ratio of nitrogen in the aluminum oxynitride film 16a may have distribution of continuously or stepwise decreasing from the channel layer 14 side toward the silicon oxide film 16b.

A film thickness of the aluminum oxynitride film 16a is, for example, 1 nm to 10 nm. The silicon oxide film 16b is in contact with the aluminum oxynitride film 16a. A film thickness of the silicon oxide film 16b is, for example, 10 nm to 40 nm.

The interlayer insulating layer 30 is provided on the gate insulating layer 16 and the gate electrode 18. The interlayer insulating layer 30 is, for example, silicon oxide, silicon oxynitride, or silicon nitride. A film thickness of the interlayer insulating layer 30 is, for example, 100 nm to 1000 nm.

An element type and an element concentration in the gate insulating layer 16 can be measured by, for example, secondary ion mass spectrometry (SIMS) and energy dispersive X-ray spectroscopy (EDX). Each film thicknesses of the gate insulating layer 16, the aluminum oxynitride film 16a, and the silicon oxide film 16b can be measured using, for example, transmission electron microscope (TEM). In addition, for example, the distance (d1 in FIG. 2) from the interface between the channel layer 14 and the aluminum oxynitride film 16a to the first position C1 and the first atomic ratio, and the distance (d2 in FIG. 2) from the interface between the silicon oxide film 16b and the aluminum oxynitride film 16a to the second position C2 and the second atomic ratio can be measured using, for example, TEM-EDX.

An impurity type and an impurity concentration in a semiconductor region can be measured by, for example, SIMS and EDX. In addition, a relative level of the impurity concentration can also be determined based on a level of a carrier concentration obtained by, for example, scanning capacitance microscopy (SCM). In addition, a distance such as a depth and a thickness of an impurity region can be obtained by SIMS, for example. In addition, a distance such as a depth, a thickness, a width, and an interval of the impurity region can also be obtained from comparison images of an SCM image and an atom probe image, for example.

Next, an example of a method for manufacturing the semiconductor device according to this embodiment will be described.

First, the substrate 10, for example, a silicon substrate is prepared. Next, for example, a multilayer structure of aluminum gallium nitride, to be the buffer layer 12, is formed by epitaxial growth on the silicon substrate. For example, the buffer layer 12 is grown by a metal organic chemical vapor deposition (MOCVD) method.

Next, undoped GaN, to be the channel layer 14, and undoped $Al_{0.25}Ga_{0.75}N$, which is to be the barrier layer 15, are formed on the buffer layer 12 by epitaxial growth. For example, the channel layer 14 and the barrier layer 15 are grown by the MOCVD method.

Next, the trench 40 penetrating through the barrier layer 15 and reaching the channel layer 14 is formed. The trench 40 is formed by, for example, reactive ion etching.

Next, the gate insulating layer 16 is formed on the channel layer 14 and the barrier layer 15.

First, the aluminum oxynitride film 16a is formed. The aluminum oxynitride film 16a has the two-layer structure.

An aluminum oxynitride film, to be the first region 16ax, is formed by, for example, an atomic layer deposition (ALD) method. A condition for film formation is set such that the first atomic ratio (N/(O+N)) of nitrogen relative to the sum (O+N) of oxygen (O) and nitrogen (N) in the aluminum oxynitride film is, for example, 0.70 to 0.87. Thereafter, annealing for densifying the aluminum oxynitride film is performed. The annealing is performed under heating temperature of 400° C. to 600° C. using, for example, an inert gas such as an argon (Ar) gas as an atmospheric gas.

Next, an aluminum oxynitride film, to be the second region 16ay, is formed on the aluminum oxynitride film, to be the first region 16ax by, for example, the ALD method. A condition for film formation is set such that the second atomic ratio (N/(O+N)) of nitrogen relative to the sum (O+N) of oxygen (O) and nitrogen (N) in the aluminum oxynitride film is, for example, 0.13 to 0.30. Thereafter, annealing for densifying the aluminum oxynitride film is performed. The annealing is performed under heating temperature of 400° C. to 600° C. using, for example, an inert gas such as an argon (Ar) gas as an atmospheric gas.

Next, the silicon oxide film 16b is formed on the aluminum oxynitride film 16a, for example, by the CVD method. The temperature at the time of deposition by the CVD method is, for example, 800° C.

Thereafter, high-temperature annealing for densifying the gate insulating layer 16 is performed. The high-temperature annealing is performed under heating temperature of 900° C. to 1050° C. for a heating time of one hour or shorter using, for example, an inert gas such as an argon (Ar) gas as an atmospheric gas.

Next, the source electrode 20, the drain electrode 22, and the gate electrode 18 are formed by a known method. Thereafter, the interlayer insulating layer 30 is formed by a known method.

The HEMT 100 illustrated in FIG. 1 is formed according to the above manufacturing method.

Hereinafter, a function and an effect of the semiconductor device of the first embodiment will be described.

In a transistor using the nitride semiconductor, charges are injected into an insulating layer formed on the nitride semiconductor, which results in degradation of characteristics such as a fluctuation of a threshold voltage, an increase of a leakage current of the insulating layer, and an increase of an on-resistance. For example, there is a risk that the threshold voltage of the transistor may fluctuate or the leakage current of the gate insulating layer may increase as charges are injected into a gate insulating layer of the transistor. Therefore, it is desired to suppress injection of charges into the gate insulating layer.

As a result of studies conducted by the inventors according to first principle calculation, it has been clearly found that a direction of a fixed dipole formed at the interface between the silicon oxide film and the aluminum oxynitride film is reversed depending on a nitrogen concentration in the aluminum oxynitride film. The HEMT 100 of the first embodiment has a gate structure that realizes the suppression of injection of charges into the gate insulating layer on the basis of the above-described new findings.

In the HEMT 100 of the first embodiment, the nitrogen concentration in the aluminum oxynitride film 16a sandwiched between the channel layer 14 and the silicon oxide film 16b is lower at the channel layer 14 side than at the gate electrode 18 side. With this configuration, the suppression of injection of charges into the gate insulating layer 16 of the HEMT 100 and the suppression of decrease in the threshold voltage are realized.

Figure 3:
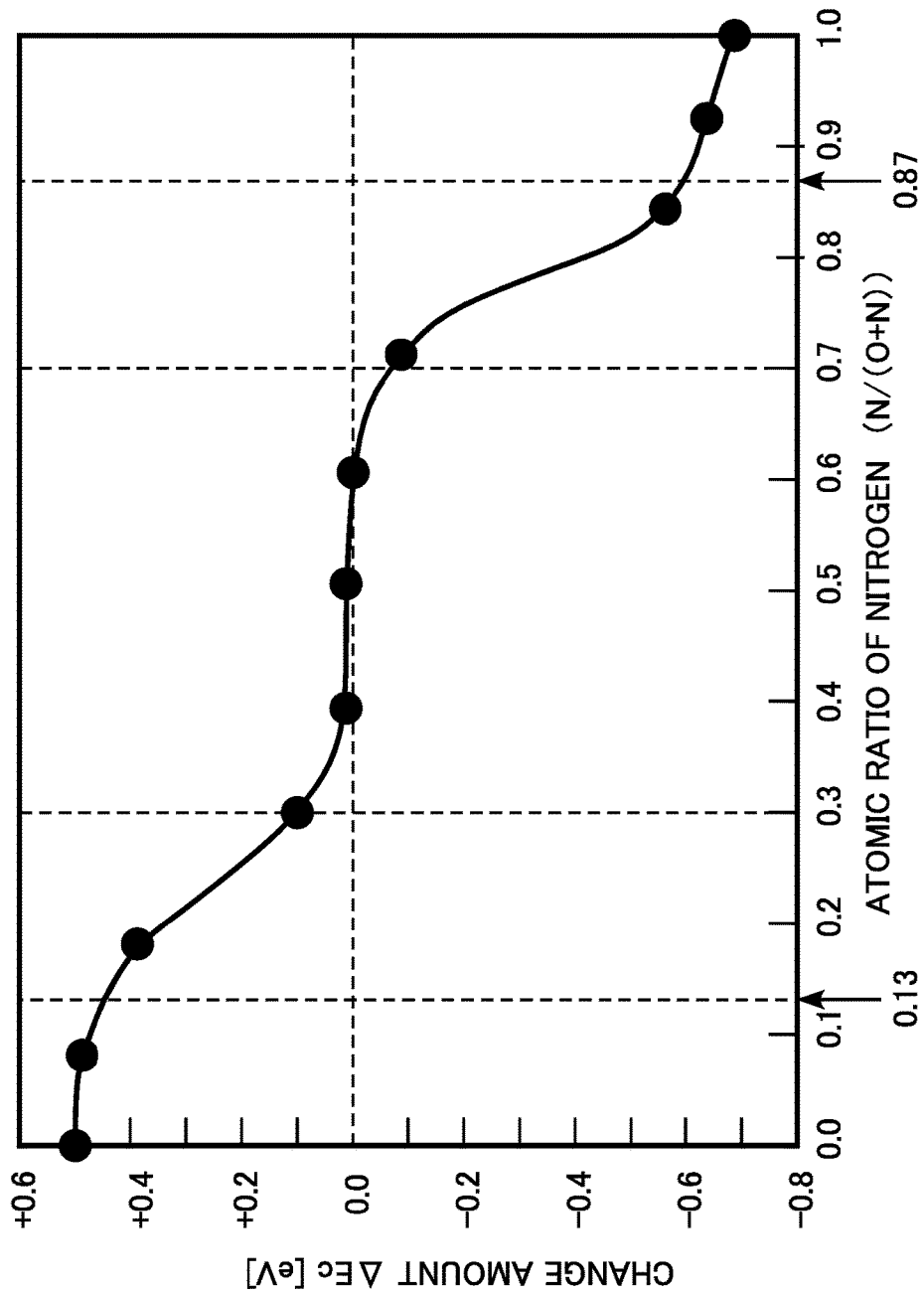
FIG. 3 is an explanatory graph of a function and an effect of the semiconductor device according to the first embodiment.

FIG. 3 is an explanatory graph of the function and the effect of the semiconductor device according to the first embodiment. FIG. 3 illustrates dependence of a change amount of a difference ($\Delta Ec$) between energy at a lower end of a conduction band of silicon oxide and energy at a lower end of a conduction band of silicon oxynitride, on the atomic ratio of nitrogen.

The change in the difference ($\Delta Ec$) between the energy at the lower end of the conduction band of silicon oxide and the energy at the lower end of the conduction band of silicon oxynitride is caused by the fixed dipole formed at the interface between the silicon oxide film and the aluminum oxynitride film. The atomic ratio of nitrogen in FIG. 3 means the atomic ratio (N/(O+N)) of nitrogen relative to the sum (O+N) of oxygen (O) and nitrogen (N) in the aluminum oxynitride film.

The change amount of $\Delta Ec$ indicates a positive value in a region where the atomic ratio of nitrogen is low, that is, the region where the nitrogen concentration is low in the aluminum oxynitride film. On the other hand, the change amount of $\Delta Ec$ indicates a negative value in a region where the atomic ratio of nitrogen is high, that is, the region where the nitrogen concentration is high in the aluminum oxynitride film. Here, a direction of a change in which $\Delta Ec$ apparently increases is referred to as "positive", and a direction of a change in which $\Delta Ec$ apparently decreases is referred to as "negative".

In this manner, the direction of the change amount of $\Delta Ec$ is reversed depending on the nitrogen concentration in the aluminum oxynitride film. This indicates that the direction of the fixed dipole formed at the interface between the silicon oxide film and the aluminum oxynitride film is reversed depending on the nitrogen concentration in the aluminum oxynitride film.

When the nitrogen concentration in the aluminum oxynitride film is low, the fixed dipole is formed to be negative on the silicon oxide film side and positive on the aluminum oxynitride film side by biasing oxygen having a negative charge toward the silicon oxide film side with respect to the interface between the silicon oxide film and the aluminum oxynitride film. On the other hand, when the nitrogen concentration in the aluminum oxynitride film is high, the fixed dipole is formed to be positive on the silicon oxide film side and negative on the aluminum oxynitride film side by biasing aluminum having a positive charge toward the silicon oxide film side with respect to the interface between the silicon oxide film and the aluminum oxynitride film.

Figure 4A:
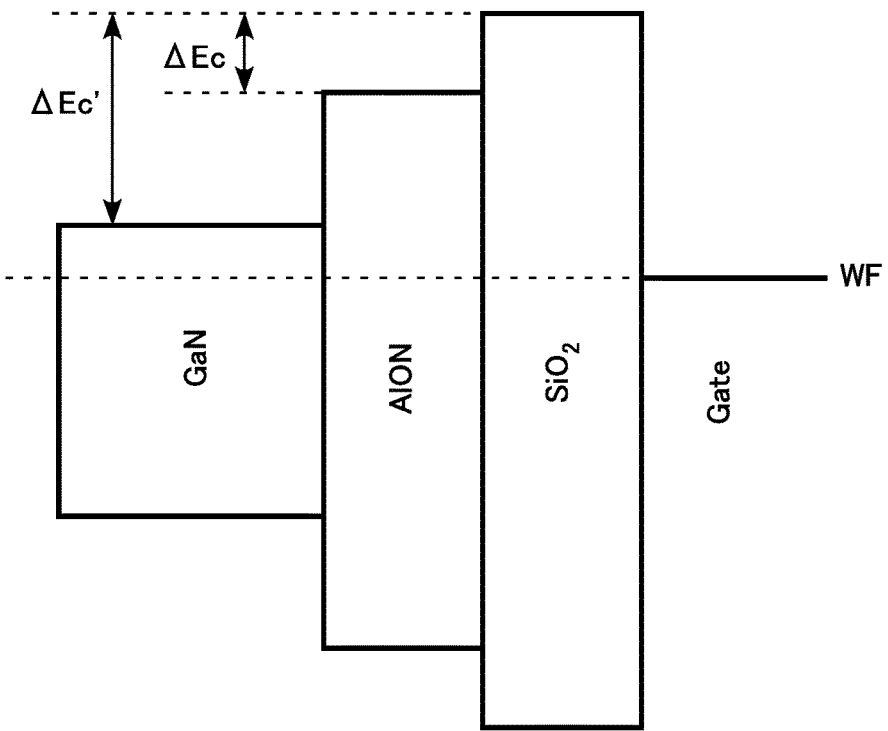
FIGS. 4A and 4B are explanatory views of the function and effect of the semiconductor device according to the first embodiment.
Figure 4B:
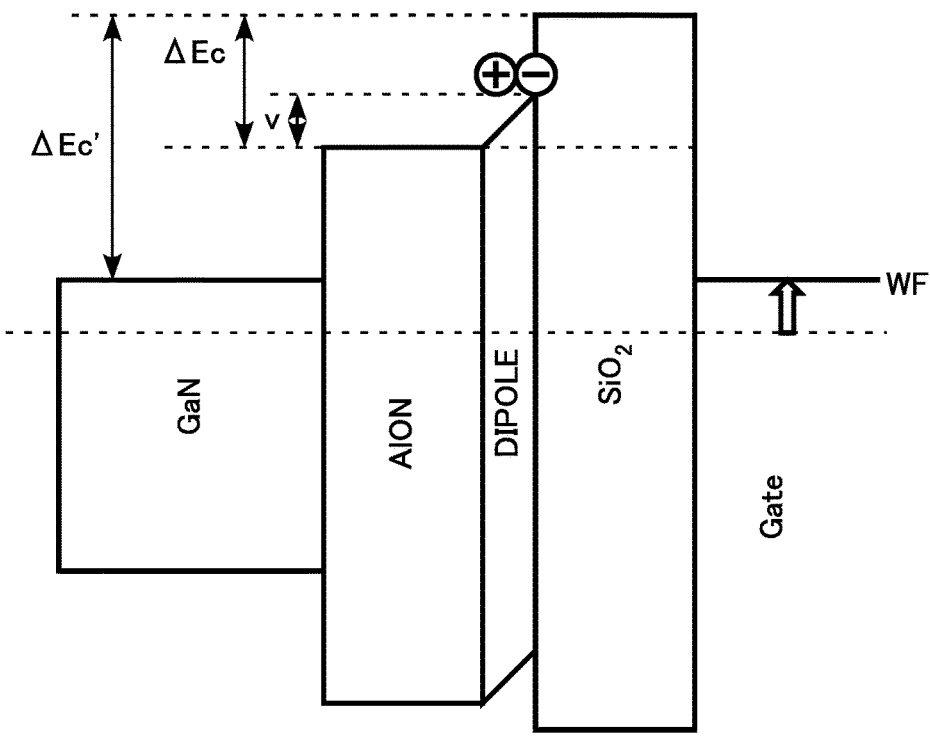

FIGS. 4A and 4B are explanatory views of the function and effect of the semiconductor device according to the first embodiment. FIGS. 4A and 4B are energy band diagrams of a metal oxide semiconductor (MOS) structure according to a first comparative example. FIGS. 4A and 4B are the energy band diagrams of parts corresponding to a part taken along a line AA' in FIG. 1.

The MOS structure according to the first comparative example has a nitride semiconductor layer ("GaN" in FIGS. 4A and 4B), a gate electrode ("Gate" in FIGS. 4A and 4B), and a gate insulating layer between the nitride semiconductor layer and the gate electrode. The gate insulating layer has an aluminum oxynitride film ("AlON" in FIGS. 4A and 4B) and a silicon oxide film ("$SiO_2$" in FIGS. 4A and 4B). It is assumed a case where a nitrogen concentration of the aluminum oxynitride film is low, that is, a case where an atomic ratio of nitrogen is low. The nitrogen concentration in the aluminum oxynitride film is uniform. It is assumed a case where the gate electrode is a metal.

FIG. 4A is the energy band diagram in a case of ignoring the presence of a fixed dipole, and FIG. 4B is the energy band diagram in a case of considering the presence of the fixed dipole.

As illustrated in FIG. 4A, there is a difference ($\Delta Ec$) between energy at a lower end of a conduction band of the silicon oxide film and energy at a lower end of a conduction band of the silicon oxynitride film. In addition, there is also a difference ($\Delta Ec'$) between the energy at the lower end of the conduction band of the silicon oxide film and energy at a lower end of a conduction band of the nitride semiconductor layer.

As illustrated in FIG. 4B, when the nitrogen concentration of the aluminum oxynitride film is low, the fixed dipole, which is negative on the silicon oxide film side and positive on the aluminum oxynitride film side, is formed. Therefore, $\Delta Ec$ apparently changes in an increasing direction (positive direction). The change amount is indicated by "v" in FIG. 4B.

The difference ($\Delta Ec'$) between the energy at the lower end of the conduction band of the silicon oxide film and energy at a lower end of a conduction band of the nitride semiconductor layer apparently increases as $\Delta Ec$ apparently increases. In other words, an energy barrier between the nitride semiconductor layer and the gate insulating layer increases. Therefore, injection of charges into the gate insulating layer is suppressed in an HEMT having the MOS structure of the first comparative example.

Incidentally, a work function ("WF" in FIGS. 4A and 4B) of the gate electrode apparently decreases as $\Delta Ec$ apparently increases. Thus, a threshold voltage of the HEMT having the MOS structure of the first comparative example decreases.

Further, when the nitrogen concentration in the gate insulating layer is low in the case of forming the gate insulating layer on the nitride semiconductor layer, there is a risk that the amount of nitrogen vacancies in the vicinity of a surface of the nitride semiconductor layer may increase so that the threshold voltage of the HEMT decreases. The nitrogen vacancies are generated by diffusion of nitrogen into the atmosphere at the time of forming the gate insulating layer. In addition, the decrease of the threshold voltage of the HEMT is caused by the nitrogen vacancies serving as supply sources of electrons, that is, donors.

For example, when the atomic ratio of nitrogen is 0.13, the change amount of $\Delta Ec$ in the positive direction is 0.42 eV as seen in FIG. 3. Thus, the energy barrier between the nitride semiconductor layer and the gate insulating layer is increased by 0.42 eV. On the other hand, a decrease of the threshold voltage accompanying the change in $\Delta Ec$ is 0.42 V.

Further, the decrease of the threshold voltage caused by the nitrogen vacancies in the vicinity of the surface of the nitride semiconductor layer is, for example, 1.0 V to 2.0 V. Then, the decrease of the threshold voltage accompanying the change in ΔEc is added, and the threshold voltage of the HEMT is decreased by 1.42 V to 2.42 V as compared to the case of considering neither the presence of the nitrogen vacancies nor the dipole.

Figure 5A:
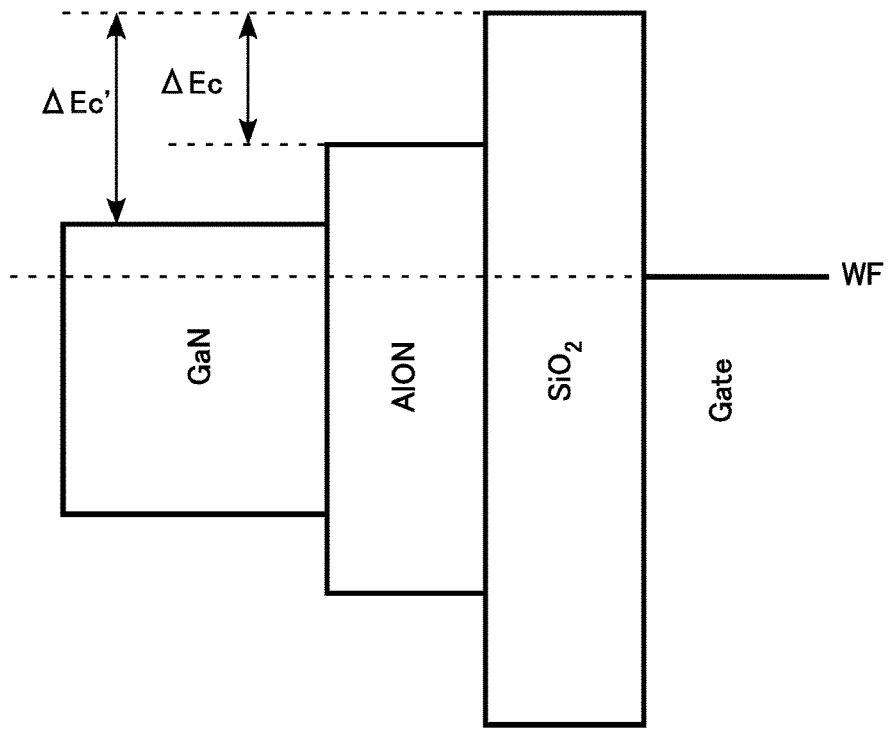
FIGS. 5A and 5B are explanatory views of the function and effect of the semiconductor device according to the first embodiment.
Figure 5B:
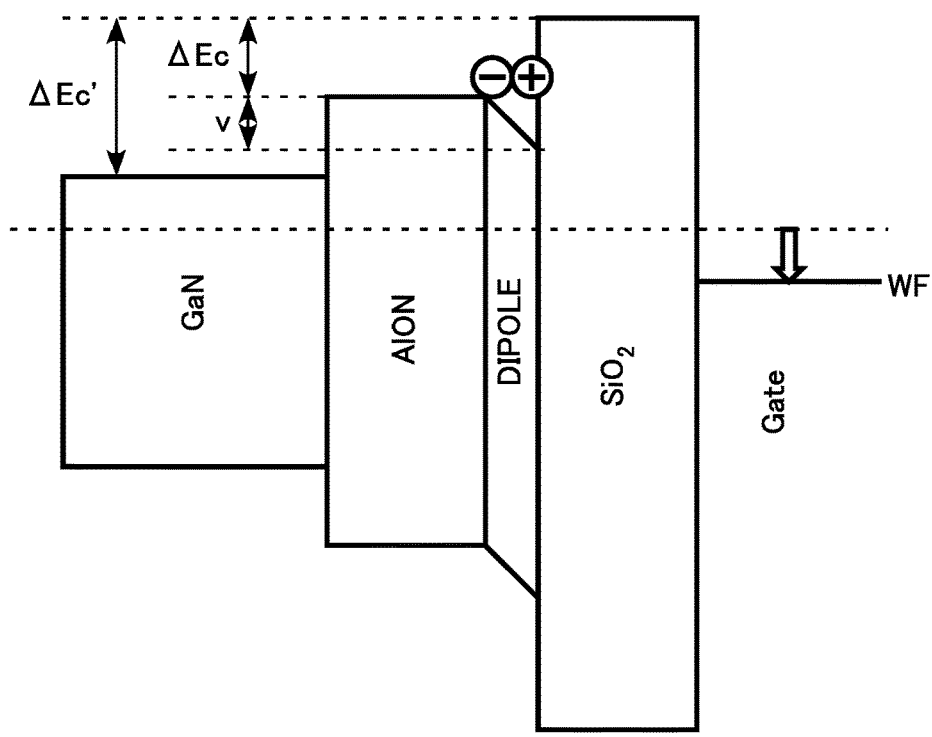

FIGS. 5A and 5B are explanatory views of the function and effect of the semiconductor device according to the first embodiment. FIGS. 5A and 5B are energy band diagrams of an MOS structure according to a second comparative example. FIGS. 5A and 5B are the energy band diagrams of parts corresponding to the part taken along the line AA' in FIG. 1.

The MOS structure of the second comparative example is different from that of the first comparative example in terms of assuming a case where a nitrogen concentration of an aluminum oxynitride film is high, that is, an atomic ratio of nitrogen is high.

Since a nitrogen concentration in a gate insulating layer is high in the case of the MOS structure of the second comparative example, the amount of nitrogen vacancies in the vicinity of a surface of a nitride semiconductor layer decreases, and decrease of a threshold voltage of an HEMT is suppressed. For example, the decrease of the threshold voltage by 1.0 V to 2.0 V is suppressed.

FIG. 5A is the energy band diagram in a case of ignoring the presence of a fixed dipole, and FIG. 5B is the energy band diagram in a case of considering the presence of the fixed dipole. Incidentally, the nitrogen concentration of the aluminum oxynitride film is higher than that of the first comparative example, a bandgap of the aluminum oxynitride film is smaller than that of the first comparative example.

As illustrated in FIG. 5A, there is a difference (ΔEc) between energy at a lower end of a conduction band of a silicon oxide film and energy at a lower end of a conduction band of a silicon oxynitride film. As illustrated in FIG. 5B, when the nitrogen concentration of the aluminum oxynitride film is high, the fixed dipole, which is positive on the silicon oxide film side and negative on the aluminum oxynitride film side, is formed. Therefore, ΔEc apparently changes in a decreasing direction (negative direction). The change amount is indicated by "v" in FIG. 5B.

As ΔEc apparently decreases, a difference (ΔEc') between the energy at the lower end of the conduction band of the silicon oxide film and energy at a lower end of a conduction band of the nitride semiconductor layer also decreases apparently. In other words, an energy barrier between the nitride semiconductor layer and the gate insulating layer decreases. Therefore, injection of charges into the gate insulating layer is promoted in the HEMT having the MOS structure of the second comparative example as compared to the case of the first comparative example.

In addition, a work function ("WF" in FIGS. 5A and 5B) of a gate electrode apparently increases as ΔEc apparently decreases. Therefore, from this viewpoint, the threshold voltage of the HEMT having the MOS structure of the second comparative example increases.

For example, when the atomic ratio of nitrogen is 0.87, the change amount of ΔEc in the negative direction is 0.60 eV as seen in FIG. 3. Thus, the energy barrier between the nitride semiconductor layer and the gate insulating layer decreases by 0.60 eV. On the other hand, the increase of the threshold voltage accompanying the change in ΔEc results in the increase of the threshold voltage of the HEMT by 0.60 V as compared to the case of considering neither the presence of nitrogen vacancies nor the dipole.

The HEMT having the MOS structure of the second comparative example can increase the threshold voltage of the HEMT by increasing the nitrogen concentration in the gate insulating layer as compared to the first comparative example. However, the injection of charges into the gate insulating layer is promoted so that there occurs the problem that the threshold voltage of the transistor fluctuates or the leakage current of the gate insulating layer increases.

Figure 6:
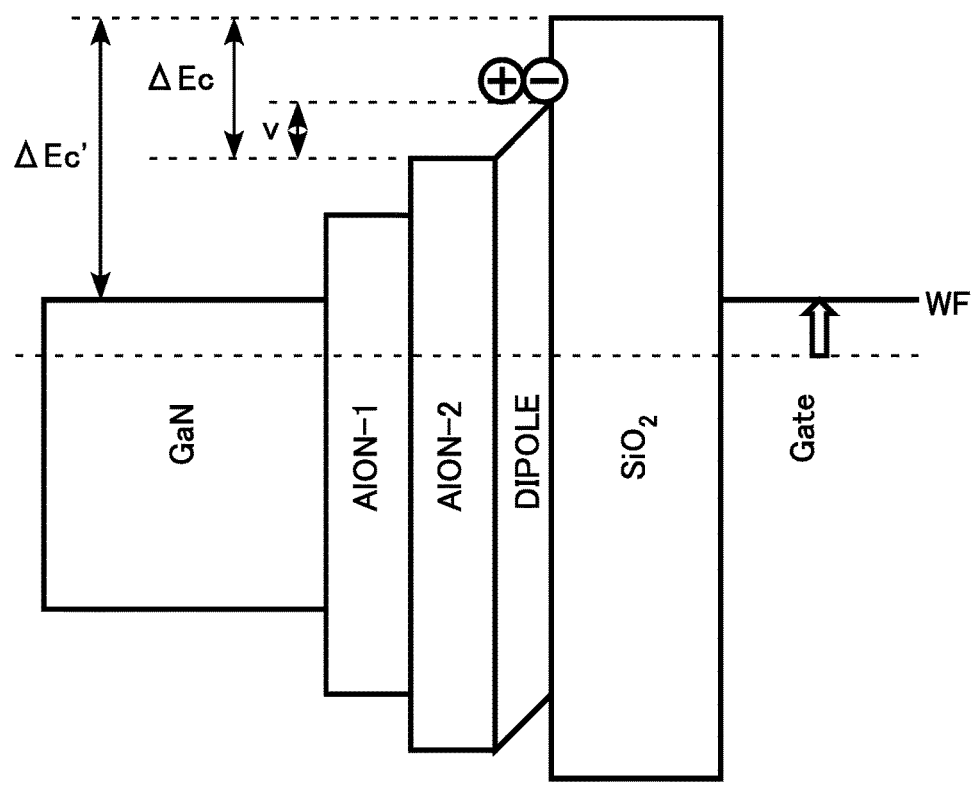
FIG. 6 is an explanatory view of the function and effect of the semiconductor device according to the first embodiment.

FIG. 6 is an explanatory view of the function and the effect of the semiconductor device according to the first embodiment. FIG. 6 is an energy band diagram of a MOS structure of the first embodiment. FIG. 6 is the energy band diagram of a part taken along the line AA' of FIG. 1.

The gate insulating layer 16 of the MOS structure of the first embodiment is different from those of the first comparative example and the second comparative example in terms that the aluminum oxynitride film 16a has the two-layer structure.

The aluminum oxynitride film 16a ("AlON-1" and "AlON-2" in FIG. 6) of the gate insulating layer 16 of the MOS structure of the first embodiment has the first region 16ax ("AlON-1" in FIG. 6) and the second region 16ay ("AlON-2" in FIG. 6).

A nitrogen concentration of the first region 16ax is higher than a nitrogen concentration of the second region 16ay. In other words, the atomic ratio of nitrogen in the first region 16ax is higher than the atomic ratio of nitrogen in the second region 16ay. Incidentally, a bandgap of the first region 16ax is smaller than that of the second region 16ay since the nitrogen concentration of the first region 16ax is higher than that of the second region 16ay. It is assumed a case where the gate electrode is a metal.

Since the nitrogen concentration of the first region 16ax is high, the amount of nitrogen vacancies in the vicinity of the surface of the nitride semiconductor layer is reduced, and the decrease of the threshold voltage of the HEMT is suppressed.

Further, the fixed dipole ("DIPOLE" in FIG. 6), which is negative on the silicon oxide film 16b side and positive on the aluminum oxynitride film 16a side, is formed since nitrogen concentration of the second region 16ay is low. Therefore, ΔEc apparently changes in an increasing direction (positive direction). The change amount is indicated by "v" in FIG. 6.

The difference (ΔEc') between the energy at the lower end of the conduction band of the silicon oxide film and energy at a lower end of a conduction band of the nitride semiconductor layer apparently increases as ΔEc apparently increases. In other words, an energy barrier between the nitride semiconductor layer and the gate insulating layer increases. Therefore, the injection of charges into the gate insulating layer is suppressed, which is similar to the MOS structure of the first comparative example.

Incidentally, a work function ("WF" in FIG. 6) of the gate electrode apparently decreases as ΔEc apparently increases. Therefore, threshold voltage of the HEMT is applied in a decreasing direction. However, the decrease of the threshold voltage is suppressed by the reduction of the nitrogen vacancies.

For example, when the atomic ratio of nitrogen is 0.13, the change amount of ΔEc in the positive direction is 0.42 eV as seen in FIG. 3. Thus, the energy barrier between the nitride semiconductor layer and the gate insulating layer is increased by 0.42 eV. On the other hand, the decrease of threshold voltage accompanying the change in $\Delta Ec$ is 0.42 V.

Since the decrease of the threshold voltage caused by the nitrogen vacancies in the vicinity of the surface of the nitride semiconductor layer is suppressed, the decrease of the threshold voltage of the HEMT is suppressed to 0.42 V as compared to the case of considering neither the presence of nitrogen vacancies nor the dipole. The decrease of the threshold voltage is suppressed to a large extent as compared to the decrease amount of 1.42 V to 2.42 V in the case of the first comparative example.

According to the HEMT 100 of the first embodiment, the suppression of injection of charges into the gate insulating layer 16 and the suppression of decrease in the threshold voltage are realized. Since the injection of charges into the gate insulating layer 16 is suppressed, the degradation of characteristics such as the fluctuation of the threshold voltage and the increase of the leakage current of the insulating layer is suppressed.

The first atomic ratio of nitrogen (N/(O+N)) relative to the sum (O+N) of oxygen (O) and nitrogen (N) in the first position (C1 in FIG. 2) in the aluminum oxynitride film 16a is preferably 0.70 to 0.87. When lower than the above-described range, there is a risk that it is difficult to sufficiently suppress the decrease of the threshold voltage caused by the nitrogen vacancies. When higher than the above-described range, the crystallization of the aluminum oxynitride film 16a progresses with heat treatment at high temperature, and there is a risk that the leakage current of the gate insulating layer 16 may increase. In addition, the crystallization of the aluminum oxynitride film 16a progresses, a trap level of the aluminum oxynitride film 16a increases, and there is a risk that the fluctuation of the threshold voltage due to the trapping of charges may increase.

The second atomic ratio of nitrogen (N/(O+N)) relative to the sum (O+N) of oxygen (O) and nitrogen (N) in the second position (C2 in FIG. 2) in the aluminum oxynitride film 16a is preferably 0.13 to 0.30. When lower than the above-described range, the crystallization of the aluminum oxynitride film 16a progresses with heat treatment at high temperature, and there is a risk that the leakage current of the gate insulating layer 16 increases. In addition, the crystallization of the aluminum oxynitride film 16a progresses, a trap level of the aluminum oxynitride film 16a increases, and there is a risk that the fluctuation of the threshold voltage due to the trapping of charges may increase. On the other hand, when higher than the above-described range, the change amount of $\Delta Ec$ caused by the fixed dipole decreases, the height of the energy barrier between the nitride semiconductor layer and the gate insulating layer 16 is insufficient, and there is a risk that the suppression of injection of charges into the gate insulating layer 16 is insufficient.

It is more preferable that the first atomic ratio in the first position (C1 in FIG. 2) be 0.70 to 0.87, and the second atomic ratio in the second position (C2 in FIG. 2) be 0.13 to 0.30. Both the suppression of the decrease of the threshold voltage and the suppression of injection of charges into the gate insulating layer 16 are realized. At this time, for example, an atomic ratio (N/(O+N)) of nitrogen relative to the sum (O+N) of oxygen (O) and nitrogen (N) at a position other than the first position and the second position is preferably set to be 0.13 to 0.87. As the above-described atomic ratio is set to 0.13 to 0.87, it is possible to maintain the entire aluminum oxynitride film 16a in an amorphous state even when the high-temperature annealing to densify the gate insulating layer 16 is performed at 900° C. or higher.

The distance (d1 in FIG. 2) from the interface between the channel layer 14 and the aluminum oxynitride film 16a to the first position C1 is preferably 0.5 nm or shorter, more preferably 0.3 nm, and still more preferably 0.1 nm or shorter. When longer than the above-described range, there is a risk that it is difficult to sufficiently suppress the decrease of the threshold voltage caused by the nitrogen vacancies.

In addition, the distance (d2 in FIG. 2) from the interface between the silicon oxide film 16b and the aluminum oxynitride film 16a to the second position C2 is preferably 0.5 nm or shorter, more preferably 0.3 nm, and still more preferably 0.1 nm or shorter. In addition, when longer than the above-described range, there is a risk that an effective fixed dipole is not formed.

The thickness of the gate insulating layer 16 is preferably 20 nm to 100 nm. In addition, the equivalent oxide thickness of the gate insulating layer 16 is preferably 20 nm to 40 nm. When thinner than the above-described range, there is a risk that the leakage current of the gate insulating layer 16 increases. In addition, there is a risk that the dielectric breakdown of the gate insulating layer 16 occurs. When thicker than the above-described range, there is a risk that a gate capacitance of the gate insulating layer 16 decreases and a driving force of the HEMT 100 decreases.

The film thickness of the aluminum oxynitride film 16a is preferably, for example, 1 nm to 10 nm. When thinner than the above-described range, there is a risk that it is difficult to maintain the distribution of the nitrogen concentration in the aluminum oxynitride film 16a. If thicker than the above-described range, there is a risk that the proportion of the aluminum oxynitride film 16a account for the gate insulating layer 16 becomes too large so that the leakage current of the gate insulating layer 16 increases. In addition, there is a risk that the trapping amount of charges to the aluminum oxynitride film 16a increases and the threshold voltage fluctuates.

Further, the gate insulating layer 16 is also formed on the barrier layer 15 between the gate electrode 18 and the drain electrode 22 in the HEMT 100. Thus, when a high drain voltage is applied, it is possible to suppress current collapse where the on-resistance increases. The current collapse is caused by trapping of charges into the interface between the nitride semiconductor layer and the insulating layer or trapping of charges into the insulating layer.

Figure 7:
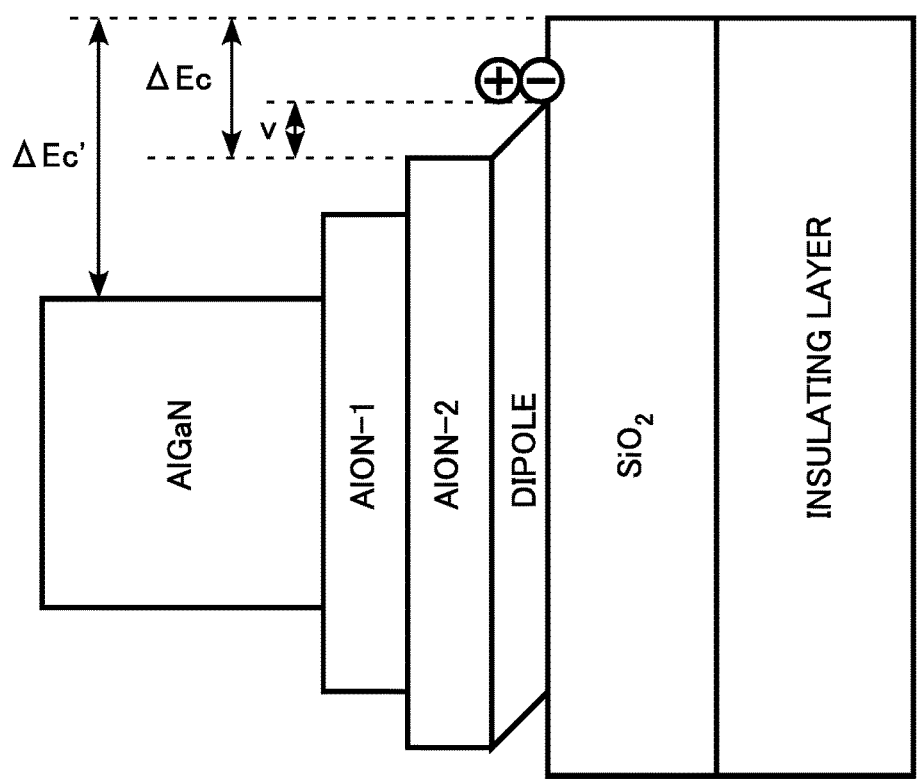
FIG. 7 is an explanatory view of the function and effect of the semiconductor device according to the first embodiment.

FIG. 7 is an explanatory view of the function and effect of the semiconductor device according to the first embodiment. FIG. 7 is an energy band diagram of a part including the interlayer insulating layer 30 ("INSULATING LAYER" in FIG. 7) of the first embodiment. FIG. 7 is the energy band diagram of a part taken along a line BB' of FIG. 1.

The nitrogen vacancies in the vicinity of the surface of the nitride semiconductor layer become the trap level of charge, which is one factor of the current collapse. Since the nitrogen concentration of the first region 16ax ("AlON-1" in FIG. 7) is high in the HEMT 100, the amount of nitrogen vacancies in the vicinity of the surface of the nitride semiconductor layer is reduced. Therefore, the trapping of charges in the vicinity of the surface of the nitride semiconductor layer is suppressed, and the current collapse is suppressed.

Then, the energy barrier between the nitride semiconductor layer and the gate insulating layer 16 increases since the nitrogen concentration of the second region 16ay ("AlON-2" in FIG. 7) is low. Therefore, the injection of charges into the gate insulating layer 16 and the interlayer insulating layer 30 is suppressed. Accordingly, the current collapse is suppressed.

As described above, the injection of charges into the gate insulating layer 16 and the interlayer insulating layer 30 is suppressed, and the degradation of characteristics, such as the fluctuation of the threshold voltage, the increase of the leakage current of the insulating layer, and the current collapse, is suppressed according to the HEMT 100 of the first embodiment.

Second Embodiment

A semiconductor device according to a second embodiment is the same as that of the first embodiment except that a gate insulating layer and a first nitride semiconductor layer are separated from each other. Therefore, the content overlapping with that in the first embodiment will not be described.

Figure 8:
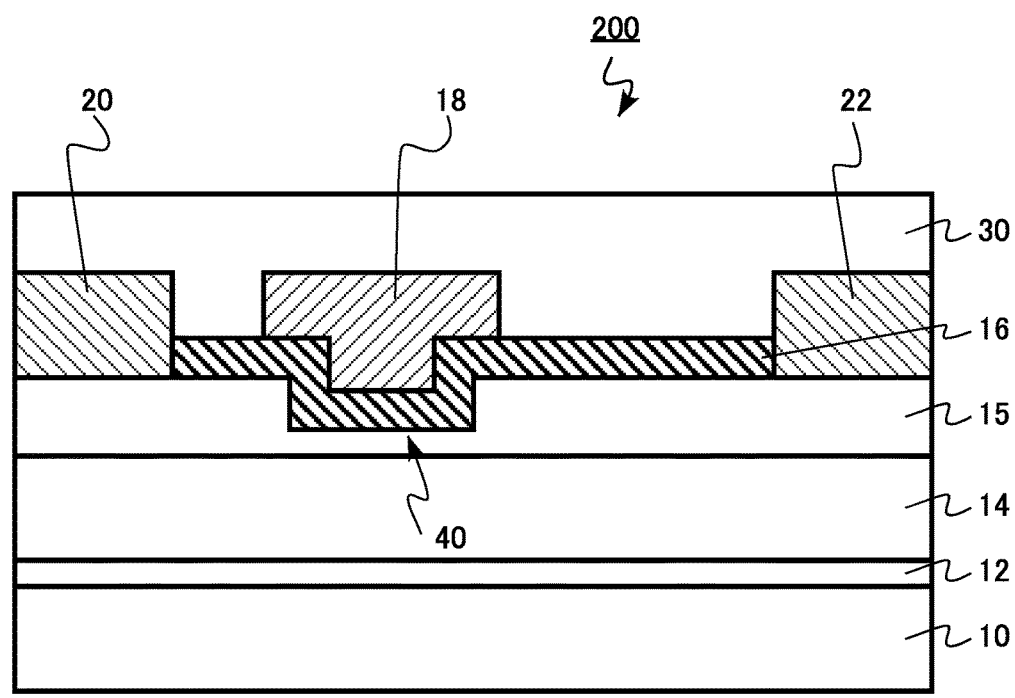
FIG. 8 is a schematic enlarged cross-sectional view of a semiconductor device according to a second embodiment.

FIG. 8 is a schematic cross-sectional view of the semiconductor device according to the second embodiment. The semiconductor device of the second embodiment is an HEMT 200 using a GaN-based semiconductor. The HEMT 200 has a gate-recess structure in which a gate electrode is provided inside a trench (recess).

The HEMT 200 includes: a substrate 10; a buffer layer 12; a channel layer 14 (the first nitride semiconductor layer); a barrier layer 15 (the second nitride semiconductor layer); a gate insulating layer 16; a gate electrode 18; a source electrode 20 (the first electrode); a drain electrode 22 (the second electrode); an interlayer insulating layer 30; and a trench 40.

The bottom of the trench 40 is positioned inside the barrier layer 15. The gate insulating layer 16 and the gate electrode 18 are formed inside the trench 40. The gate insulating layer 16 and the channel layer 14 are separated from each other. In other words, the barrier layer 15 is provided between the gate insulating layer 16 and the channel layer 14.

The gate insulating layer 16 has the same configuration as the first embodiment.

In the HEMT 200, a thickness of the barrier layer 15 below the gate electrode 18 is thin so that the density of a two-dimensional electron gas below the gate electrode 18 is reduced and a threshold voltage increases. Further, it is possible to realize a normally-off operation, for example, by inserting a p-type layer (not illustrated) between the gate electrode 18 and the gate insulating layer 16.

According to the HEMT 200 of the second embodiment, degradation of characteristics, such as fluctuation of the threshold voltage, an increase of a leakage current of the insulating layer, and current collapse, is suppressed due to the same function as the first embodiment.

Third Embodiment

A semiconductor device according to a third embodiment includes: a first nitride semiconductor layer; a second nitride semiconductor layer positioned on the first nitride semiconductor layer and having a larger bandgap than the first nitride semiconductor layer; a first electrode positioned on the first nitride semiconductor layer and electrically connected to the first nitride semiconductor layer; a second electrode positioned on the first nitride semiconductor layer and electrically connected to the first nitride semiconductor layer; a gate electrode positioned on the first nitride semiconductor layer between the first electrode and the second electrode; and an insulating layer positioned on the second nitride semiconductor layer between the gate electrode and the second electrode, including a silicon oxide film and an aluminum oxynitride film between the second nitride semiconductor layer and the silicon oxide film, and having a first atomic ratio of nitrogen relative to a sum of oxygen and nitrogen at a first position in the aluminum oxynitride film which is higher than a second atomic ratio of nitrogen relative to a sum of oxygen and nitrogen at a second position, closer to the silicon oxide film than the first position, in the aluminum oxynitride film.

The semiconductor device of the third embodiment is different from that of the first embodiment in terms that neither a trench nor a gate insulating layer is provided but a p-type layer is provided between a gate electrode and a nitride semiconductor layer. Hereinafter, the content overlapping with that in the first embodiment will not be described.

Figure 9:
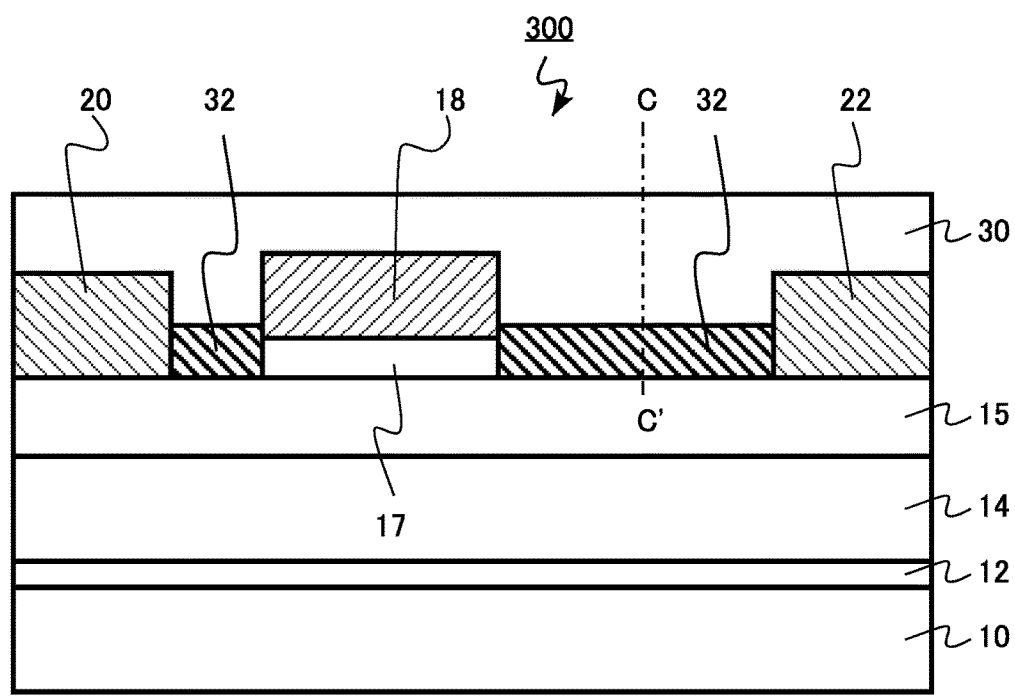
FIG. 9 is a schematic cross-sectional view of a semiconductor device according to a third embodiment.

FIG. 9 is a schematic cross-sectional view of the semiconductor device according to the third embodiment. The semiconductor device of the third embodiment is an HEMT 300 using a GaN-based semiconductor.

The HEMT 300 includes: a substrate 10; a buffer layer 12; a channel layer 14 (the first nitride semiconductor layer); a barrier layer 15 (the second nitride semiconductor layer); a p-type layer 17; a gate electrode 18; a source electrode 20 (the first electrode); a drain electrode 22 (the second electrode); an interlayer insulating layer 30; and a protective insulating layer 32 (insulating layer).

The p-type layer 17 is, for example, gallium nitride containing p-type impurities. As the HEMT 300 includes the p-type layer 17 between the barrier layer 15 and the gate electrode 18, the threshold voltage increases, and it is possible to realize a normally-off operation.

The protective insulating layer 32 is positioned on the barrier layer 15 between the gate electrode 18 and the drain electrode 22. In addition, the protective insulating layer 32 is positioned on the barrier layer 15 between the gate electrode 18 and the source electrode 20.

Figure 10:
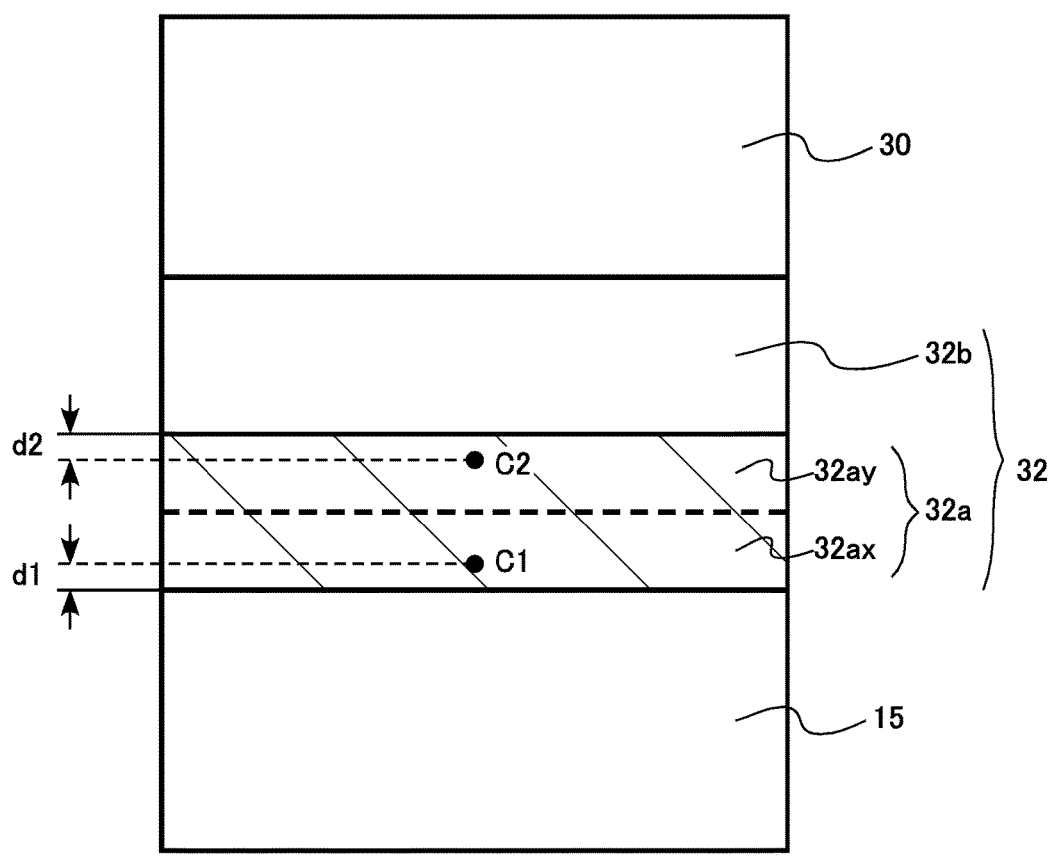
FIG. 10 is a schematic enlarged cross-sectional view of the semiconductor device according to the third embodiment.

FIG. 10 is a schematic enlarged cross-sectional view of the semiconductor device according to the third embodiment. FIG. 10 is the enlarged view of the protective insulating layer 32 between the barrier layer 15 and the interlayer insulating layer 30. FIG. 10 is the view of a part taken along a line CC' of FIG. 9.

The protective insulating layer 32 has an aluminum oxynitride film 32a and a silicon oxide film 32b. The aluminum oxynitride film 32a is positioned between the barrier layer 15 and the silicon oxide film 32b.

The aluminum oxynitride film 32a is in contact with the barrier layer 15. The silicon oxide film 32b is in contact with the interlayer insulating layer 30. The aluminum oxynitride film 32a is, for example, amorphous.

The aluminum oxynitride film 32a contains aluminum (Al), oxygen (O), and nitrogen (N) as main constituent elements. A first atomic ratio (N/(O+N)) of nitrogen relative to a sum (O+N) of oxygen (O) and nitrogen (N) at a first position (C1 in FIG. 10) in the aluminum oxynitride film 32a is higher than a second atomic ratio of nitrogen (N/(O+N)) relative to a sum (O+N) of oxygen (O) and nitrogen (N) at a second position (C2 in FIG. 10) closer to the silicon oxide film 32b than the first position C1 in the aluminum oxynitride film 32a. In other words, the aluminum oxynitride film 32a has a nitrogen concentration on the barrier layer 15 side which is higher than a nitrogen concentration on the interlayer insulating layer 30 side.

The aluminum oxynitride film 32a has a two-layer structure. The aluminum oxynitride film 32a includes a first region 32ax and a second region 32ay. The second region 32ay is positioned between the first region 32ax and the silicon oxide film 32b. The first position C1 is in the first region 32ax, and the second position C2 is in the second region 32ay.

The first atomic ratio is, for example, 0.70 to 0.87. The second atomic ratio is, for example, 0.13 to 0.30.

The first position C1 is, for example, in the vicinity of an interface between the barrier layer 15 and the aluminum oxynitride film 32a. For example, a distance (d1 in FIG. 10) from the interface between the barrier layer 15 and the aluminum oxynitride film 32a to the first position C1 is 0.5 nm or shorter.

The second position C2 is, for example, in the vicinity of an interface between the silicon oxide film 32b and the aluminum oxynitride film 32a. For example, a distance (d2 in FIG. 10) from the interface between the silicon oxide film 32b and the aluminum oxynitride film 32a to the second position C2 is 0.5 nm or shorter.

For example, the distribution of the nitrogen concentration in the aluminum oxynitride film 32a may have gradient distribution of decreasing from the barrier layer 15 side toward the silicon oxide film 32b. In other words, an atomic ratio of nitrogen in the aluminum oxynitride film 32a may have distribution of continuously or stepwise decreasing from the barrier layer 15 side toward the silicon oxide film 32b.

A film thickness of the aluminum oxynitride film 32a is, for example, 1 nm to 10 nm. The silicon oxide film 32b is in contact with the aluminum oxynitride film 32a. A film thickness of the silicon oxide film 32b is, for example, 10 nm to 40 nm.

Figure 11:
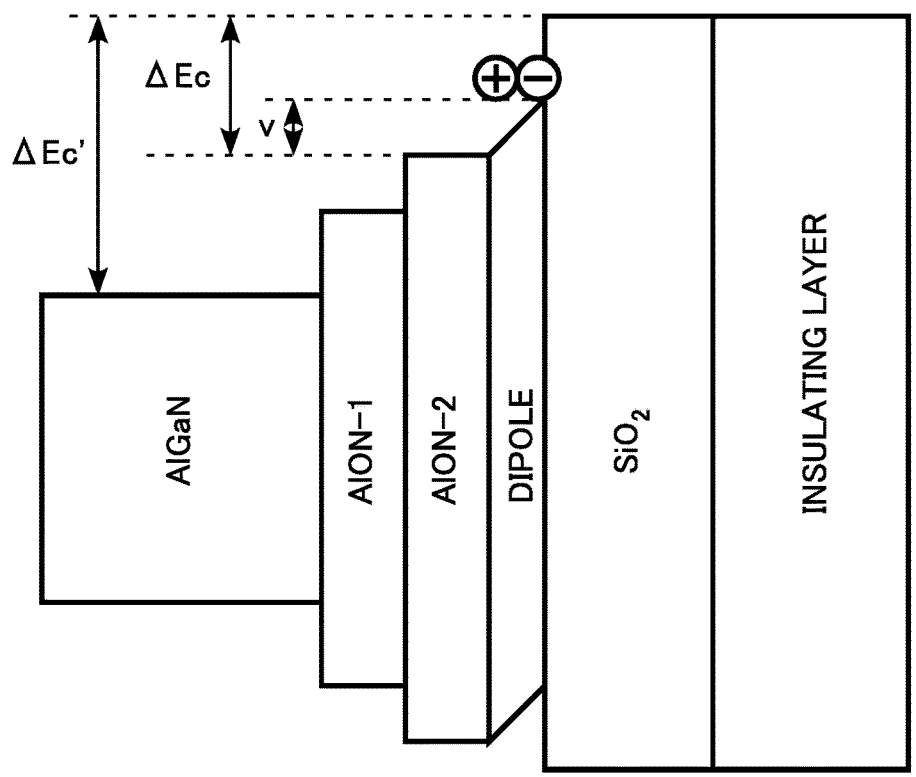
FIG. 11 is an explanatory view of a function and an effect of the semiconductor device according to the third embodiment.

FIG. 11 is an explanatory view of the function and the effect of the semiconductor device according to the third embodiment. FIG. 11 is an energy band diagram of a part including the interlayer insulating layer 30 ("INSULATING LAYER" in FIG. 7) of the third embodiment. FIG. 11 is the energy band diagram of the part taken along the line CC' of FIG. 9.

When nitrogen vacancies are present in the vicinity of the surface of the nitride semiconductor layer, a charge trap level is formed, which is one factor of current collapse. Since the nitrogen concentration of the first region 32ax ("AlON-1" in FIG. 11) is high in the HEMT 300, the amount of nitrogen vacancies in the vicinity of the surface of the nitride semiconductor layer is reduced. Therefore, the trapping of charges in the vicinity of the surface of the nitride semiconductor layer is suppressed, and the current collapse is suppressed.

Then, the energy barrier between the nitride semiconductor layer and the protective insulating layer 32 increases since the nitrogen concentration of the second region 32ay ("AlON-2" in FIG. 11) is low. Therefore, the injection of charges into the protective insulating layer 32 and the interlayer insulating layer 30 is suppressed. Accordingly, the current collapse is suppressed.

The first atomic ratio of nitrogen (N/(O+N)) relative to the sum (O+N) of oxygen (O) and nitrogen (N) in the first position (C1 in FIG. 10) in the aluminum oxynitride film 32a is preferably 0.70 to 0.87. When lower than the above-described range, there is a risk that it is difficult to sufficiently suppress the trapping of charges caused by the nitrogen vacancies. When higher than the above-described range, the crystallization of the aluminum oxynitride film 32a progresses, the trap level in the aluminum oxynitride film 32a increases, there is a risk that the current collapse caused by the trapping of charges increases.

The second atomic ratio of nitrogen (N/(O+N)) relative to the sum (O+N) of oxygen (O) and nitrogen (N) in the second position (C2 in FIG. 10) in the aluminum oxynitride film 32a is preferably 0.13 to 0.30. When lower than the above-described range, the crystallization of the aluminum oxynitride film 32a progresses, the trap level in the aluminum oxynitride film 32a increases, there is a risk that the current collapse caused by the trapping of charges increases. On the other hand, when higher than the above-described range, the change amount of ΔEc caused by the fixed dipole decreases, the height of the energy barrier between the nitride semiconductor layer and the protective insulating layer 32 is insufficient, and there is a risk that the suppression of injection of charges into the protective insulating layer 32 or the interlayer insulating layer 30 is insufficient.

It is more preferable that the first atomic ratio in the first position (C1 in FIG. 10) be 0.70 to 0.87, and the second atomic ratio in the second position (C2 in FIG. 10) be 0.13 to 0.30. Both the suppression of the decrease of the threshold voltage and the suppression of injection of charges into the gate insulating layer 16 are realized. At this time, for example, an atomic ratio (N/(O+N)) of nitrogen relative to the sum (O+N) of oxygen (O) and nitrogen (N) at a position other than the first position and the second position is preferably set to be 0.13 to 0.87. As the above-described atomic ratio is set to 0.13 to 0.87, it is possible to maintain the entire aluminum oxynitride film 32a in an amorphous state even when the high-temperature annealing to densify the protective insulating layer 32 is performed at 900° C. or higher.

The distance (d1 in FIG. 10) from the interface between the barrier layer 15 and the aluminum oxynitride film 32a to the first position C1 is preferably 0.5 nm or shorter, more preferably 0.3 nm, and still more preferably 0.1 nm or shorter. When longer than the above-described range, there is a risk that it is difficult to sufficiently suppress the current collapse caused by the nitrogen vacancies.

In addition, the distance (d2 in FIG. 10) from the interface between the silicon oxide film 32b and the aluminum oxynitride film 32a to the second position C2 is preferably 0.5 nm or shorter, more preferably 0.3 nm, and still more preferably 0.1 nm or shorter. In addition, when longer than the above-described range, there is a risk that an effective fixed dipole is not formed.

The film thickness of the aluminum oxynitride film 32a is preferably, for example, 1 nm to 10 nm. When thinner than the above-described range, there is a risk that it is difficult to maintain the distribution of the nitrogen concentration in the aluminum oxynitride film 32a. When thicker than the above-described range, there is a risk that the trapping amount of charges to the aluminum oxynitride film 32a increases and the current collapse increases.

As described above, the injection of charges into the protective insulating layer 32 and the interlayer insulating layer 30 is suppressed, and the degradation of characteristics caused by the current collapse is suppressed according to the HEMT 300 of the third embodiment.

Fourth Embodiment

A power supply circuit and a computer according to a fourth embodiment include the HEMT according to the first to third embodiments.

Figure 12:
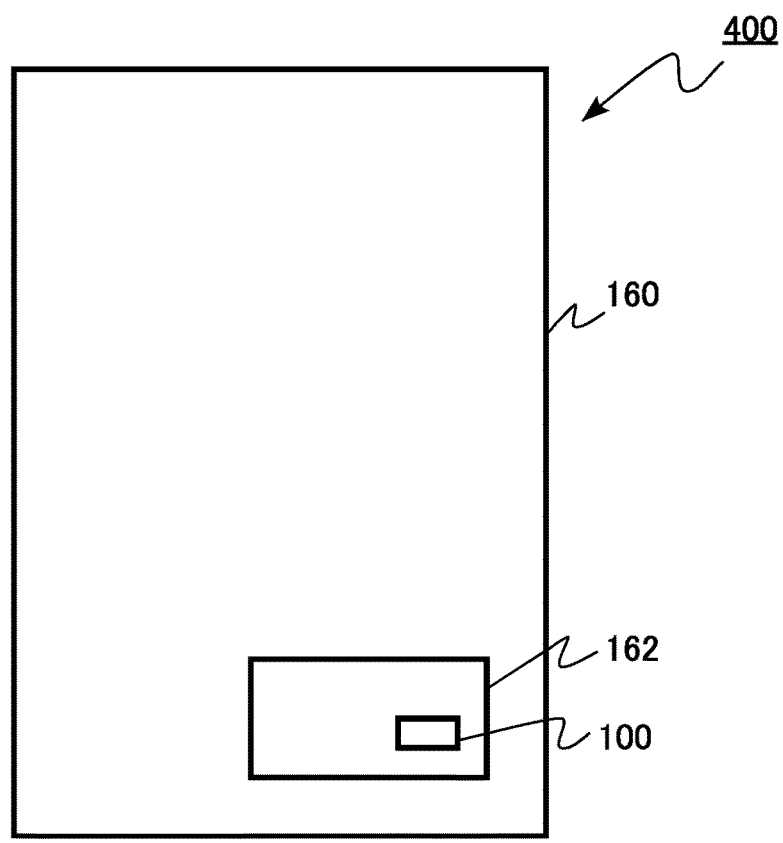
FIG. 12 is a schematic view of a computer according to a fourth embodiment.

FIG. 12 is a schematic view of the computer according to the fourth embodiment. The computer of the fourth embodiment is, for example, a server 400.

The server 400 has a power supply circuit 162 in a housing 160. The server 400 is a computer that runs server software. The power supply circuit 162 includes, for example, the HEMT 100 of the first embodiment.

A stable operation of the power supply circuit 162 is realized by including the HEMT 100 in which degradation of characteristics is suppressed. In addition, a stable operation of the server 400 is realized by including the power supply circuit 162.

According to the fourth embodiment, it is possible to realize the power supply circuit and the computer whose stable operation is realized.

Although the GaN and AlGaN containing gallium (Ga) have been described as an example of the nitride semiconductor in the first to third embodiments, it is also possible to apply, for example, InGaN, InAlN, InAlGaN containing indium (In).

In addition, the undoped AlGaN has been described as an example of the barrier layer 15 in the first to third embodiments, but it is also possible to apply n-type AlGaN.

In addition, the HEMT having the gate-recess structure has been described as an example in the first and second embodiments, but it is also possible to apply the present disclosure to an HEMT that does not have a gate-recess structure but have a planar gate structure.

In addition, the HEMT using the two-dimensional electron gas as the carrier has been described as an example in the first to third embodiments, but it is also possible to apply the present disclosure to an ordinary metal oxide semiconductor field effect transistor (MOSFET) that does not use the two-dimensional electron gas.

While certain embodiments have been described, these embodiments have been presented by way of example only, and are not intended to limit the scope of the inventions. Indeed, the semiconductor device, the power supply circuit, and the computer described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first nitride semiconductor layer;
    a second nitride semiconductor layer disposed on the first nitride semiconductor layer and having a larger bandgap than that of the first nitride semiconductor layer;
    a first electrode disposed on or above the first nitride semiconductor layer and electrically connected to the first nitride semiconductor layer;
    a second electrode disposed on or above the first nitride semiconductor layer and electrically connected to the first nitride semiconductor layer;
    a gate electrode disposed above the first nitride semiconductor layer, the gate electrode disposed between the first electrode and the second electrode; and
    a gate insulating layer disposed between the first nitride semiconductor layer and the gate electrode, the gate insulating layer including a silicon oxide film and an aluminum oxynitride film, the aluminum oxynitride film disposed between the first nitride semiconductor layer and the silicon oxide film, a first atomic ratio of nitrogen relative to a sum of oxygen and nitrogen at a first position in the aluminum oxynitride film being higher than a second atomic ratio of nitrogen relative to a sum of oxygen and nitrogen at a second position in the aluminum oxynitride film, and the second position being closer to the silicon oxide film than the first position.

2. The semiconductor device according to claim 1, wherein
    the first atomic ratio is 0.70 to 0.87.

3. The semiconductor device according to claim 1, wherein
    the second atomic ratio is 0.13 to 0.30.

4. The semiconductor device according to claim 1, wherein
    a distance from an interface between the first nitride semiconductor layer and the aluminum oxynitride film or an interface between the second nitride semiconductor layer and the aluminum oxynitride film to the first position is 0.5 nm or shorter, and
    a distance from an interface between the silicon oxide film and the aluminum oxynitride film to the second position is 0.5 nm or shorter.

5. The semiconductor device according to claim 1, wherein
    a film thickness of the aluminum oxynitride film is 1 nm to 10 nm.

6. The semiconductor device according to claim 1, wherein
    a thickness of the gate insulating layer is 20 nm to 100 nm.

7. The semiconductor device according to claim 1, wherein
    the gate insulating layer is in contact with the first nitride semiconductor layer.

8. The semiconductor device according to claim 1, wherein
    the gate insulating layer and the first nitride semiconductor layer are separated from each other.

9. The semiconductor device according to claim 1, wherein
    the first nitride semiconductor layer is gallium nitride and the second nitride semiconductor layer is aluminum gallium nitride.

10. A power supply circuit comprising the semiconductor device according to claim 1.

11. A computer comprising the semiconductor device according to claim 1.

* * * * *